United States Patent [19]

Johnson

[11] 4,117,588
[45] Oct. 3, 1978

[54] METHOD OF MANUFACTURING THREE DIMENSIONAL INTEGRATED CIRCUITS

[75] Inventor: Leopold J. Johnson, Escondico, Calif.

[73] Assignee: The United States of America as represented by the Secretary of the Navy, Washington, D.C.

[21] Appl. No.: 761,749

[22] Filed: Jan. 24, 1977

[51] Int. Cl.² .................................. H01F 41/02
[52] U.S. Cl. .................... 29/608; 29/602 R; 29/625; 264/61; 336/200; 336/233; 361/397
[58] Field of Search .................. 29/602 R, 604, 608, 29/625; 156/89; 336/200, 233; 264/177 R, 61, 60, 272; 361/397, 406, 409, 411

[56] References Cited

U.S. PATENT DOCUMENTS

| 3,322,871 | 5/1967 | Noack et al. | 264/61 X |
|---|---|---|---|
| 3,325,881 | 6/1967 | Engelking | 29/625 |
| 3,852,877 | 12/1974 | Ahn et al. | 29/625 |
| 3,948,706 | 4/1976 | Schmeckenbecher | 29/625 X |

OTHER PUBLICATIONS

"Laminated Memory Construction with Discrete Ferrite Memory Elements", RCA Tech. Notes No. 664, Nov. 1965 by Drukaroff et al.
"Sliced Laminate, Printed Circuit Interconnections", IBM Tech. Disclosure Bull., vol. 10, No. 11, Apr. 1968, by Peter et al.

Primary Examiner—Carl E. Hall
Attorney, Agent, or Firm—R. S. Sciascia; G. J. Rubens; T. M. Phillips

[57] ABSTRACT

A method of manufacturing three dimensional integrated circuits from compatible co-fireable materials by extruding batched co-fireable materials to form blocks of specified cross-sections, selecting and stacking cross-section of various widths from different blocks in a specified manner to form the desired circuit and placing the stack in a furnace having a predetermined temperature time profile to properly sinter each of the materials.

5 Claims, 5 Drawing Figures

METHOD OF MANUFACTURING THREE DIMENSIONAL INTEGRATED CIRCUITS

BACKGROUND OF THE INVENTION

This invention relates to three dimensional integrated circuits and more particularly to a method of manufacturing three dimensional integrated circuits from compatible co-fireable materials.

Various types of multi-layer circuits have previously been proposed. In general these have comprised individual sheets of a dielectric material with electrical conductors arranged in some desired pattern on the surface of each of the sheets. Provision for inter-connecting parts of the different layers is usually made by punching holes at desired locations in the dielectric sheet, placing wires in these holes and filling the remainder of the holes with solder.

In other methods of manufacturing semiconductor integrated devices of this type the ceramic green sheets are prepared and communicating feed through holes are mechanically punched through them. A metalizing paste is prepared and screened on the sheet and in the holes in a desired circuit pattern. After laminating the registered and stacked green sheets into an integral whole with the circuit patterns buried in them, they are sintered to burn off the binder material in the sheets and to densify the sheets. The metalized paste forms porous capillaries communicating within the unitized whole which are subsequently filled with a conductive material by capillary float techniques. These means of fabrication, as is readily apparent, are cumbersome and make it difficult to fabricate the desired integrated circuit.

SUMMARY OF THE INVENTION

The present invention provides a method for rapidly mass producing complex integrated circuit elements from compatible co-fireable materials. It is also possible that the complexity of the three dimensional circuits which can be fabricated in accordance with the teaching of the invention cannot be realized by any known conventional method. The method includes the steps of selecting a number of compatible co-fireable materials from a group in accordance with the specific electrical requirement of the circuit or element to be fabricated; batching each of the compatible, co-fireable materials with a suitable binder to form a plurality of different discrete composite materials in a condition for extrusion; extruding said discrete composite materials together in a predetermined pattern to form an extruded three dimensional geometrical configuration. A circuit may be formed by multiple batch extrusion by inserting the appropriate conducting or non-conducting material into a compound controllable die at the appropriate time. Circuits are also formed by selecting slices of extruded blocks having the appropriate electrical configuration and stacking these in a manner to form the desired electrical circuit. The stacked sections of extruded blocks are then compressed and fired in a furnace at a predetermined temperature time profile to burn off (or vaporize) each of the binding materials according to its particular point of vaporization.

Accordingly, it is an object of the present invention to provide a method of manufacturing three dimensional integrated circuit elements from compatible co-fireable materials.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
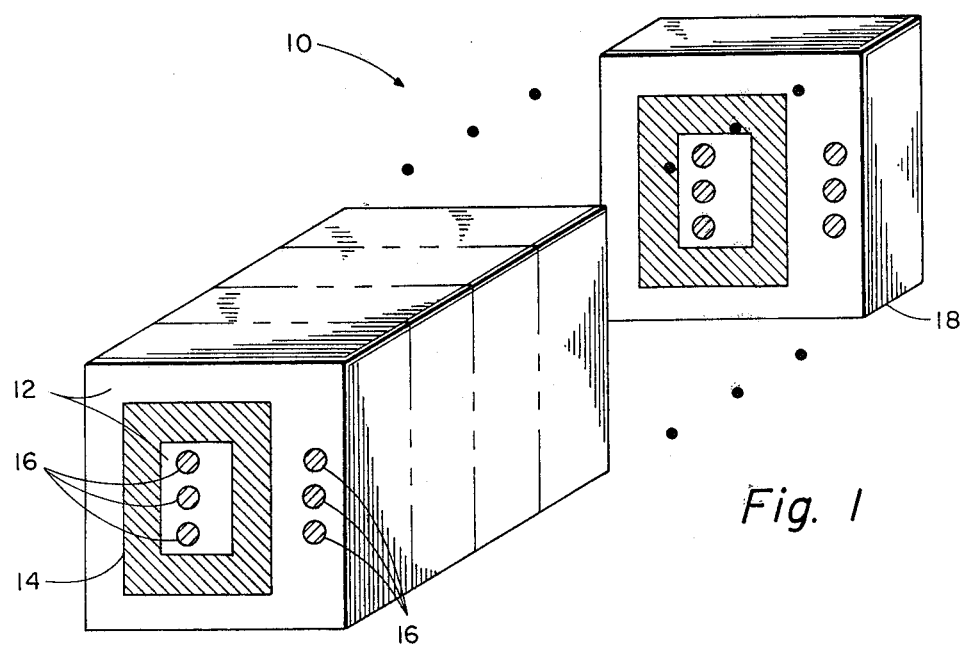
FIG. 1 is an oblique view of an extrusion showing the uniform cross-section throughout the length of the extrusion.

Referring now to FIG. 1 wherein there is shown an extruded block 10 made up of three different types of composite materials, 12, 14 and 16, each having different electrical properties. Each of the composite materials 12, 14 or 16 may be either green ceramic or glass which is mixed with a binder material in the conventional batching process. Each of these composite materials are then combined in an extrusion process in the well known manner to produce an extruded block 10 having the desired geometric configuration, i.e., insulating material 12 in the center surrounding three rod like electrical conducting portions 16 with the center insulating material being surrounded by a magnetic core material 14 and an outer insulating portion 12 having embedded on one side three electrical conducting portions. Extrusion processes to combine different materials to obtain a particular geometric configuration is well known and is illustrated by the well known Christmas candies with multi color pictures of uniform cross-section for the full length of the block of candy. The respective electrical properties of the composite materials are such that material 12 is a good insulating material such as aluminum oxide, material 14 is suitable for a transformer core such as ferrite composition, and material 16 is a good conductor such as a silver glass frit mixture.

Figure 2A:
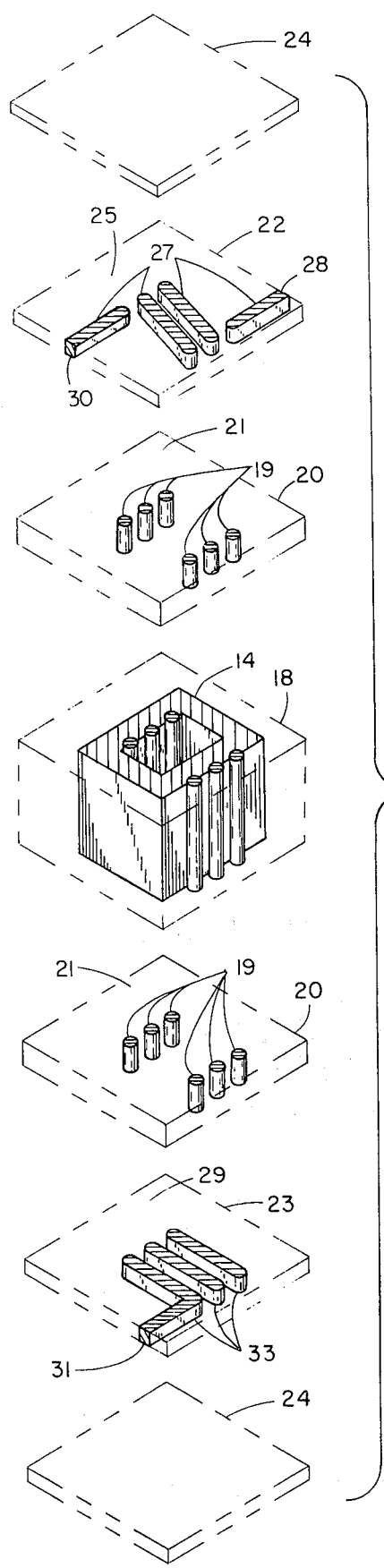
FIG. 2a is an exploded view of a transformer type device formed from sections taken from different extrusions.

Examples of ferrite compositions include nickel-ferrite, nickel-cobalt ferrite, manganese-magnesium ferrite and yttrium-iron garnet. The extruded block 10 of FIG. 1 may be sliced at different thicknesses to obtain block sections of any desired width. Referring to FIG. 2a, there is shown one such section 18 of the extruded block of FIG. 1, arranged in a predetermined manner with other sections 20, 22, 23 and 24. The other sections 20, 22, 23 and 24 are taken from other extruded blocks (not illustrated) which may be made from appropriate amounts of composite material in the same manner as the extruded block 10 of FIG. 1. Sections 20 consist of conducting portions 19 and insulating material 21. Section 22 consists of insulating material 25 and conducting material 27. Section 23 consists of insulating material 29 and conducting material 33. Sections 24 consist only of insulating material.

Figure 2B:
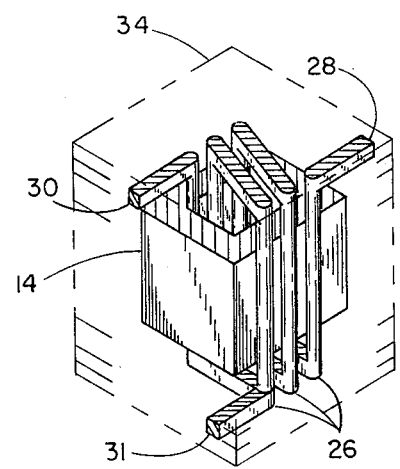
FIG. 2b shows the stacked elements in place forming the transformer device.

As shown in FIGS. 2a and 2b when the sections 18 through 24 are compressed together the several sections form a windings 26 with terminals 28, 30 and 31.

Figure 3:
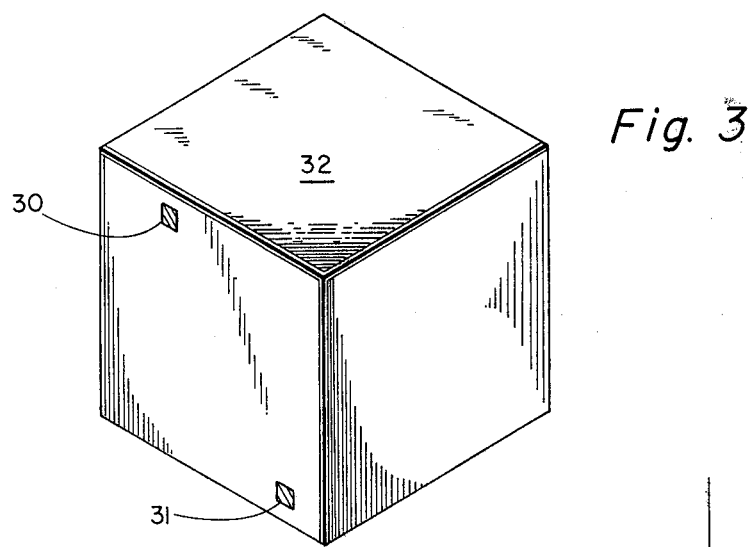
FIG. 3 shows the transformer of FIG. 2b after being fired.
Figure 4:
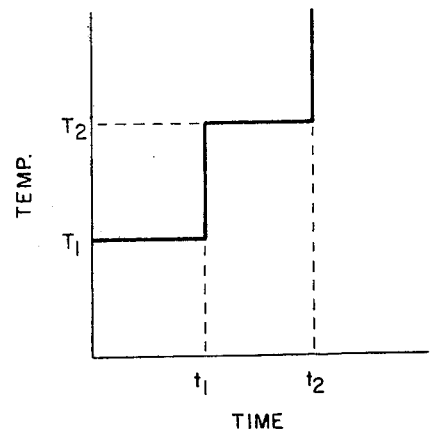
FIG. 4 shows a typical temperature time distribution curve for firing the element of FIG. 3.

As shown in FIG. 2b the stack of sections 18 through 24 are pressed together to eliminate surface boundaries between adjacent sections. This forms a three dimensional structure having a coil 26 wound around a magnetic core 14. The coil 26 and core 14 are completely enclosed in a block of non-conducting material 34 except for the three contact terminals 28, 30 and 31. The stacked structure of FIG. 2b is then placed in a furnace to burn off (or vaporize) the binders of each composite material and the structure to obtain an integrated ceramic circuit 32 as shown in FIG. 3. A typical temperature-time profile of a furnace is shown in FIG. 4 so that the binder of the different composite materials may be vaporized off successively to prevent creation of voids within the integrated circuit. For example, the binding material having the lowest vaporization point is burned out of the structure before the binding material having the next highest vaporization point.

If desired, the transformer device may be single block extruded rather than laminated. In this case a controllable complex die is necessary. The extrusion ports of the compound die will be controlled to accomplish variability in pattern to continually form interconnecting material extrusions instead of requiring separate dies and the laminate structure.

While the above description pertains only to the construction of a relatively simple integrated circuit, a coil wound around a transformer core to form an auto transformer, the same principle may be employed to provide a very complex integrated circuit and circuit elements from co-fireable materials.

Obviously many modifications and variations of the present invention are possible in the light of the above teachings. It is therefore to be understood that within the scope of the appended claims the invention may be practiced otherwise than as specifically described.

I claim:
1. A method of manufacturing three-dimensional integrated circuit elements from compatible co-fireable materials the steps of:
    (a) selecting a number of different compatible co-fireable materials from a group in accordance with a specific electrical requirement;
    (b) batching together selected groups of the compatible co-fireable materials with a suitable binder to form a plurality of different discrete composite materials in a condition suitable for extrusion;
    (c) extruding said discrete composite materials together in predetermined patterns to form extruded blocks having uniform cross-section throughout the entire length of the block,
    (d) stacking a plurality of sections, said plurality of sections having at least one section of specified width from a plurality of different extruded blocks and being in registry such that patterns on different sections are superposed in a desired circuit pattern,
    (e) applying temperature and pressure to said stacked sections in a furnace according to a predetermined temperature-time profile.
2. The method of claim 1 wherein the different discrete composite materials include electrical conducting, electrical insulating and magnetic core materials.
3. The method of claim 2 wherein said electrical conducting material is a silver glass frit mixture.
4. The method of claim 2 wherein said insulating material is aluminum oxide.
5. The method of claim 2 wherein said magnetic core material is a ferrite composition.

* * * * *